(12) United States Patent
McLeod et al.

(10) Patent No.: US 10,162,264 B2
(45) Date of Patent: Dec. 25, 2018

(54) LIQUID DEPOSITION PHOTOLITHOGRAPHY

(71) Applicant: The Regents of the University of Colorado, a body corporate, Denver, CO (US)

(72) Inventors: Robert R. McLeod, Boulder, CO (US); Adam Urness, Boulder, CO (US); Michael Cole, Longmont, CO (US); Eric Moore, Boulder, CO (US)

(73) Assignee: The Regents Of The University Of Colorado, A Body Corporate, Denver, CO (US)

( * ) Notice: Subject to any disclaimer, the term of this patent is extended or adjusted under 35 U.S.C. 154(b) by 105 days.

(21) Appl. No.: 14/713,748

(22) Filed: May 15, 2015

(65) Prior Publication Data

US 2015/0261091 A1    Sep. 17, 2015

Related U.S. Application Data

(62) Division of application No. 13/849,256, filed on Mar. 22, 2013, now Pat. No. 9,034,568.

(Continued)

(51) Int. Cl.
*G03F 7/20* (2006.01)
*G03F 7/00* (2006.01)

(52) U.S. Cl.
CPC .......... *G03F 7/2041* (2013.01); *G03F 7/0035* (2013.01); *G03F 7/2022* (2013.01); *G03F 7/70* (2013.01); *G03F 7/70341* (2013.01)

(58) Field of Classification Search
CPC .... G03F 7/0035; G03F 7/2041; G03F 7/2022; G03F 7/70
See application file for complete search history.

(56) References Cited

U.S. PATENT DOCUMENTS 4,752,498 A    6/1988  Fudim
5,175,077 A   12/1992  Grossa
(Continued)

FOREIGN PATENT DOCUMENTS

CN        1845795 A    10/2006
JP       62-99753 A     5/1987
(Continued)

OTHER PUBLICATIONS

English translation of JP Publication S6299753, May 1987.*
(Continued)

*Primary Examiner* — Brittany L Raymond
(74) *Attorney, Agent, or Firm* — Perkins Coie LLP (57) ABSTRACT

Systems and methods for liquid deposition photolithography are described. In particular, some embodiments relate to systems and methods for using photolithography to control the 2D structure of a thin layer of material (e.g., photopolymer) using various masks, projection optics and materials. In one or more embodiments, this thin layer can be manipulated by micro-fluidic techniques such that it can be formed, patterned and post-processed in a liquid environment, vastly simplifying the creation of multi-layer structures. Multiple layers are rapidly built up to create thick structures of possibly multiple materials that are currently challenging to fabricate by existing methods.

28 Claims, 7 Drawing Sheets

Related U.S. Application Data (60) Provisional application No. 61/614,356, filed on Mar. 22, 2012.

(56) References Cited

U.S. PATENT DOCUMENTS

| | | | |
|---|---|---|---|
| 5,937,493 | A | 8/1999 | Nellissen |
| 6,051,179 | A | 4/2000 | Hagenau et al. |
| 2005/0084613 | A1* | 4/2005 | wang ............... B82Y 10/00 427/282 |
| 2006/0088789 | A1 | 4/2006 | Fries |
| 2009/0015922 | A1 | 1/2009 | St. Hilaire |
| 2010/0125356 | A1 | 5/2010 | Shkolnik et al. |
| 2011/0182805 | A1 | 7/2011 | Desimone et al. |

FOREIGN PATENT DOCUMENTS

| | | | |
|---|---|---|---|
| JP | S6299753 | * | 5/1987 |
| JP | 7-13337 A | | 1/1995 |
| JP | 2005-534063 A | | 11/2005 |
| WO | WO 2004-009489 | * | 1/2004 |
| WO | WO 2004/009489 A2 | | 1/2004 |

OTHER PUBLICATIONS

Chinese Patent Application No. 201380027151.X, Office Action, 23 pages, dated Nov. 4, 2015.

European Patent Application No. EP 13763769.0, Extended Supplementary Search Report, 9 pages, dated Oct. 7, 2015.

Japanese Patent Application No. 2015-501940, Office Action, 8 pages, dated Oct. 14, 2015.

Dendukuri, Dhananjay et al., "Continuous-Flow Lithography for High-Throughput Microparticles Synthesis," Nature Materials, vol. 5, pp. 365-369, May 2006.

International Application No. PCT/US2013/033581, International Search Report & Written Opinion, 8 pages, dated Jun. 20, 2013.

Jang, Ji-Hyun et al., "A Route to Three-Dimensional Structures in a Microfluidic Device: Stop-Flow Interference Lithography," Angew. Chem. Int. Ed., vol. 46, pp. 9027-9031, 2007.

Scott, Timothy F. et al., "Two-Color Single-Photon Photoinitiation and Photoinhibition for Subdiffraction Photolithography," Science, vol. 324, pp. 913-917, May 15, 2009.

Singapore Application No. 11201405876Y, Written Opinion, 8 pages, Apr. 22, 2015.

Urness, Adam C. et al., "Liquid Deposition Photolithography for Submicrometer Resolution Three-Dimensional Index Structuring With Large Throughput," Light: Science & Applications, vol. 2, 6 pages, 2013.

Urness, Adam C. et al., "Lithographic Fabrication of Multi-Layered Optical Data Storage," Nonlinear Optics, Optical Society of America, paper OME2, 2011.

Urness, Adam C., Doctoral Thesis for "Liquid Deposition Photolithography for Efficient Three Dimensional Structuring," Department of Electrical, Computer and Energy Engineering, University of Colorado, 179 pages, 2013.

* cited by examiner

LIQUID DEPOSITION PHOTOLITHOGRAPHY

CROSS-REFERENCE TO RELATED APPLICATIONS

This application is a divisional of U.S. patent application Ser. No. 13/849,256 filed Mar. 22, 2013, which claims priority to U.S. Provisional Patent Application No. 61/614,356 filed Mar. 22, 2012, both of which are incorporated herein by reference for all purposes.

STATEMENT REGARDING FEDERALLY SPONSORED RESEARCH

This invention was made with government support under grant number IIP0822695 awarded by the National Science Foundation. The government has certain rights in the invention.

TECHNICAL FIELD

Various embodiments of the present invention generally relate to systems and methods for photolithography. In particular, some embodiments relate to systems and methods for liquid deposition photolithography.

BACKGROUND

Photolithography generally refers to an optical process used to transfer geometric patterns onto a substrate. Many traditional photolithography techniques use a light-sensitive polymer (commonly referred to as a "photoresist") to create geometric patterns. A negative photoresist becomes polymerized after exposure to light, while positive photoresists allow the pattern created by exposure to the light to be removed. As a result, two-dimensional and three-dimensional relief images can be created on the substrate by exposing the light sensitive polymer to a curing light. The curing light is typically an ultraviolet light. In many cases, multiple treatments of the light-sensitive polymer can be used to create complex geometric patterns.

One of the advantages of photolithography is the ability to create extremely small complex patterns. However, traditional systems typically require a flat substrate and are not very effective at creating shapes that are not flat. In addition, traditional versions of the process can be time consuming and expensive, especially for complex patterns. As a result, there is a need for improved systems and methods for photolithography.

SUMMARY

Various embodiments of the present invention generally relate to systems and methods for photolithography. In particular, some embodiments relate to systems and methods for practicing photolithography wherein forming, patterning, and post processing take place in a liquid environment. Some embodiments provide for a liquid deposition photolithography system for creating physical structures common in electronics (e.g., circuits), optics (e.g., lenses and holograms), mechanics (e.g., MEMs) and biology (e.g., tissue scaffolds) or combinations of these. The system can include an exposure chamber, an optical pattern generator, an optical window, and/or a material delivery subsystem. The exposure chamber can house materials for forming customized physical or refractive index structures. The materials can include a photo-sensitive liquid having mobile monomers that can be locally polymerized when exposed to an optical intensity pattern created by the optical pattern generator.

The optical window can be configured to separate the exposure chamber from the optical pattern generator. In accordance with some embodiments, the optical window allows the intensity pattern to enter the exposure chamber thereby modifying the properties of the materials within the exposure chamber. The optical window can include a solid layer, for example, to provide mechanical support and shape retention. The material delivery subsystem can be configured to deliver the materials to the exposure chamber.

Embodiments of the present invention also include computer-readable storage media containing sets of instructions to cause one or more processors to perform the methods, variations of the methods, and other operations described herein.

In some embodiments, a liquid layer can be inserted between the previously-fabricated structure and the optical window. An optical pattern can be projected through the window to modify the properties of the photo-sensitive liquid. One such modification is photopolymerization which causes hardening, diffusion or solvent resistance. The photosensitive process may be constrained from occurring immediately adjacent to the mask by various techniques. For example, a chemical inhibitor can be used in some embodiments which slowly diffuses out of the bottom layer of the window to create a thin layer of liquid material which has no sensitivity to the optical pattern. Thus, the bottom of the window provides the function of a mold (flat or otherwise), while the inhibitor provides the function of a mold release. In this implementation, there is no wear on the mold because solid material never is in contact.

The base platform can be moved (e.g., away from the window by a precise distance) to make room for the next layer, and the process is repeated. The base movement can be controlled by modern stages to the nanometer level, enabling very accurate layer control. While these steps are representative, many variants are possible. For example, non-photosensitive liquids such as solvents can also be utilized for specific patterning steps. In some embodiments, the various steps are compressed to a single machine with a number of advantages.

While multiple embodiments are disclosed, still other embodiments of the present invention will become apparent to those skilled in the art from the following detailed description, which shows and describes illustrative embodiments of the invention. As will be realized, the invention is capable of modifications in various aspects, all without departing from the scope of the present invention. Accordingly, the drawings and detailed description are to be regarded as illustrative in nature and not restrictive.

BRIEF DESCRIPTION OF THE DRAWINGS

Embodiments of the present invention will be described and explained through the use of the accompanying drawings in which.

The drawings have not necessarily been drawn to scale. For example, the dimensions of some of the elements in the figures may be expanded or reduced to help improve the understanding of the embodiments of the present invention. Similarly, some components and/or operations may be separated into different blocks or combined into a single block for the purposes of discussion of some of the embodiments of the present invention. Moreover, while the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims.

DETAILED DESCRIPTION

Various embodiments of the present invention generally relate to systems and methods for photolithography. In particular, some embodiments relate to systems and methods for practicing photolithography wherein forming, patterning, and post processing take place in a liquid environment. Some embodiments provide for a liquid deposition photolithography system for the fabrication of physical structures common in electronics (e.g., circuits), optics (e.g., lenses and holograms), mechanics (e.g., MEMs) and biology (e.g., tissue scaffolds) or combinations of these. The liquid deposition system can use photolithography to control the two-dimensional structure of a thin layer of material (e.g., photopolymer) using masks, projection optics and materials. In some embodiments, the liquid deposition system can create a thin layer that is manipulated by micro-fluidic techniques such that the layer can be formed, patterned and post-processed in a liquid environment, vastly simplifying the creation of multi-layer structures. Multiple layers of the structure are rapidly built up to create thick structures of possibly multiple materials that are currently challenging to fabricate by existing methods.

In some embodiments of the present invention, a solid window can be used to enable hydraulic delivery of liquid precursor such that many layers can rapidly be fabricated at high speed and the layer thickness can be arbitrarily thin. The interior of this window can be arranged to resist attachment of the solidified liquids such that high throughput one-photon absorption can be used for the photolithography. Scanning or projection optical lithography can selectively pattern the material properties including liquid/solid phase, density, index or chemical composition. The interior of the window can shape the surface of the part on large scale (e.g., a lens) or on fine scale similar to photo-nanoimprint lithography.

The systems and methods provided by various embodiments of the present invention enable complex structures to be created by having the material flow away from an optical window to build up multi-layer structures. In contrast, some traditional systems allow liquid flows across (e.g., parallel or substantially parallel to) the window thus allowing only a single exposure into the full thickness of the material. In addition, in traditional commercial stereolithography, the first and second functions of the window are provided by a blade which spreads a flat, uniform layer of uncovered, liquid material on top of a three-dimensional part which is moved (e.g., downwards, rotated, etc.) on a stage. The spreading of new material by the blade in these traditional systems is time consuming and becomes more so as the layer thickness decreases. The minimum height of the layer is approximately five microns and control of the thickness is approximately +/−one micron. The techniques employed by these systems limit the process to flat layers. Moreover, the fabrication of parts with multiple materials would require removal of a partly finished part, cleaning with solvent, then replacing and re-aligning the part in a second liquid material.

One advantage of some embodiments is the use of a closed system which enables rapid insertion of very flat layers of new liquids. Each liquid layer can be a different material than the previous, which is not possible with the open "bucket" of liquid used in stereolithography. Two-photon "micro-stereolithography" sometimes uses a similar exposure geometry in which a scanning laser is focused through a window onto a platform. Like traditional stereolithography, the focus polymerizes a pattern, then the platform is moved away from the focus and the process repeats to build up complex 3D structures at micron scale. Polymerization on the window is suppressed by the 2-photon response of the polymer. Some advantages of the disclosed system are 1) the use of an efficient, 1-photon processes and highly-parallel mask lithography and 2) multiple materials are easily handled. In addition, some traditional systems use only immiscible materials in adjacent layers would eliminate many interesting structures.

In the following description, numerous specific details are set forth in order to provide a thorough understanding of embodiments of the present invention. It will be apparent, however, to one skilled in the art that embodiments of the present invention may be practiced without some of these specific details. In other instances, well-known structures and devices are shown in block diagram form.

Embodiments of the present invention include various steps, which will be described below. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

For example, some embodiments provide for a graphical user interface module to generate one or more graphical user interface screens configured to take instructions, receive design objectives, and convey results, a general-purpose or special-purpose "communications module" for interfacing with one or more other modules and devices (e.g., a fabrication device or fabrication control module), a "design module" to receive and process a set of constraints that mathematically express the design objectives, computation and fabrication limitations, a "fabrication module" to control the fabrication devices in order to fabricate the devices using liquid deposition photolithography, as well as other modules for providing various functionality needed by embodiments of the present invention. Still yet, some embodiments may incorporate two or more of these modules into a single module and/or associate a portion of the functionality of one or more of these modules with a different module.

In the following description, for the purposes of explanation, numerous specific details are set forth in order to provide a thorough understanding of embodiments of the present invention. It will be apparent, however, to one skilled in the art that embodiments of the present invention may be practiced without some of these specific details. Embodiments of the present invention may be provided as a computer program product which may include a machine-readable medium having stored thereon instructions which may be used to program a computer (or other devices or machines) to perform a process or to cause a process to be performed. The machine-readable medium may include, but is not limited to, floppy diskettes, optical disks, compact disc read-only memories (CD-ROMs), and magneto-optical disks, ROMs, random access memories (RAMs), erasable programmable read-only memories (EPROMs), electrically erasable programmable read-only memories (EEPROMs), application-specific integrated circuits (ASICs), magnetic or optical cards, flash memory, or other type of media/machine-readable medium suitable for storing electronic instructions. Moreover, embodiments of the present invention may also be downloaded as a computer program product, wherein the program may be transferred from a remote computer to a requesting computer by way of data signals embodied in a carrier wave or other propagation medium via a communication link (e.g., a modem or network connection).

Terminology

Brief definitions of terms, abbreviations, and phrases used throughout this application are given below.

The terms "connected" or "coupled" and related terms are used in an operational sense and are not necessarily limited to a direct physical connection or coupling. Thus, for example, two devices may be coupled directly, or via one or more intermediary media or devices. As another example, devices may be coupled in such a way that information can be passed there between, while not sharing any physical connection with one another. Based on the disclosure provided herein, one of ordinary skill in the art will appreciate a variety of ways in which connection or coupling exists in accordance with the aforementioned definition.

The phrases "in some embodiments," "according to various embodiments," "in the embodiments shown," "in other embodiments," and the like generally mean the particular feature, structure, or characteristic following the phrase is included in at least one embodiment of the present invention, and may be included in more than one embodiment of the present invention. In addition, such phrases do not necessarily refer to the same embodiments or to different embodiments.

If the specification states a component or feature "may", "can", "could", or "might" be included or have a characteristic, that particular component or feature is not required to be included or have the characteristic.

General Description

Figure 1:
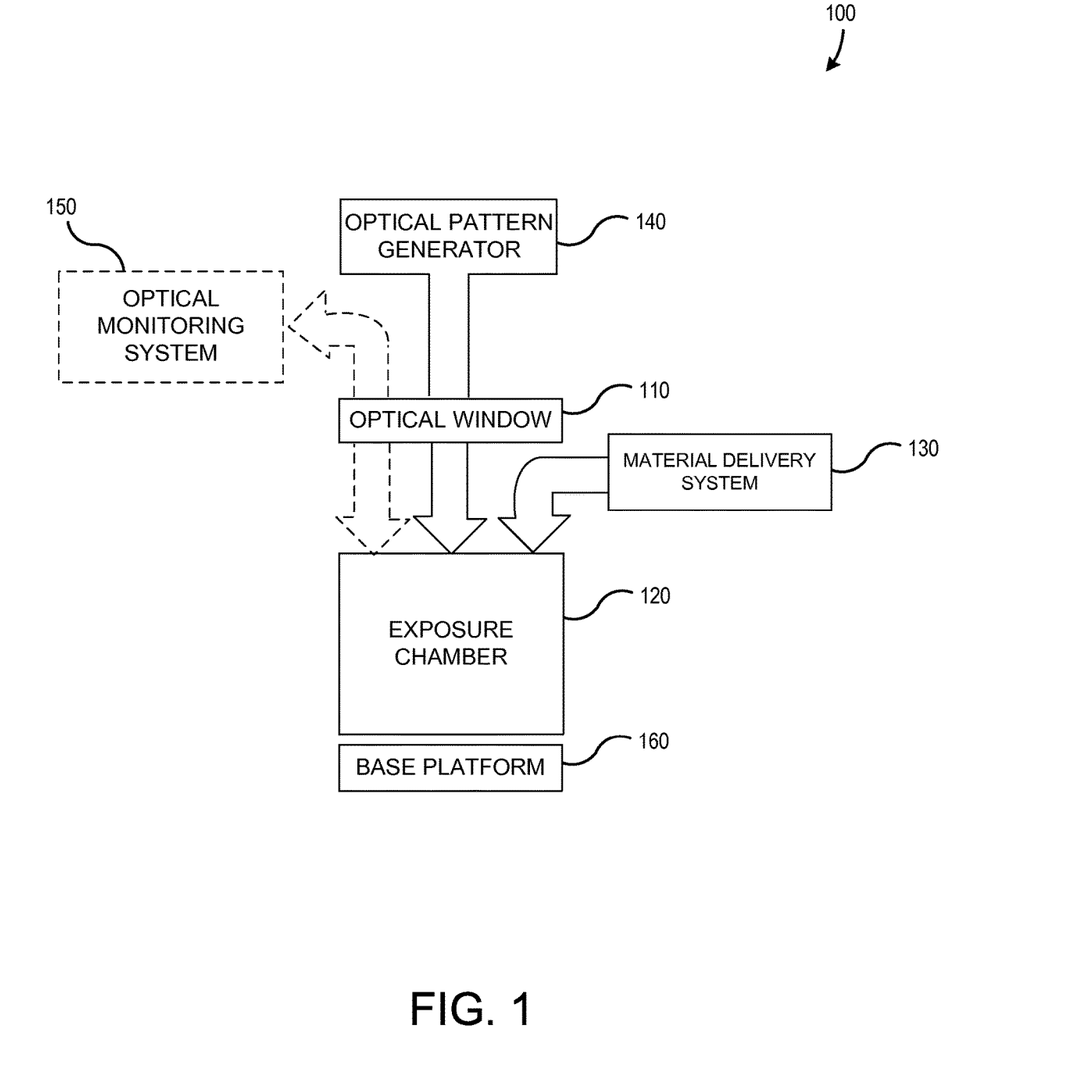
FIG. 1 depicts a high-level block diagram of a system for practicing liquid deposition photolithography in accordance with various embodiments of the present invention.

FIG. 1 illustrates a high-level block diagram of a processing environment 100 in which physical structures common in electronics (e.g., circuits), optics (e.g., lenses and holograms), mechanics (e.g., MEMs), biology (e.g., tissue scaffolds), and/or combinations thereof may be produced in accordance with various embodiments of the present invention. As illustrated in FIG. 1, the processing environment 100 provides for various components that can be used to perform multiple steps used in a single machine. The machine can include an optical window 110, exposure chamber 120, material delivery system 130, optical pattern generator 140, optical monitoring system 150, and base platform 160. In contrast to traditional photolithography systems, various embodiment of the present invention replace spin coating by micro-fluidic injection and planarization by molding on the non-contact window. In some embodiments, a mold may be used to slowly release a radical inhibitor ($O_2$) to maintain a thick layer (e.g., approximately one micron) of material precursors that is not photosensitive and therefore stays in the liquid state even when illuminated by the photomask.

Alignment of this photomask, which can provide a significant barrier to many-layer nano-patterning, is vastly simplified by repetitive exposures on a single tool. The layout also allows the material to be held in a thin, liquid layer between the mold (see, e.g., FIGS. 3A-3B, 310) and the previously-fabricated layer, removing the traditional need for binders and solvents, accelerating reaction rates and minimizing material waste. The system thus combines the high-throughput and non-contact advantages of mask projection with the surface control of soft lithography. By compressing the multiple processes of traditional lithography to a single machine, thousands of individual layers can be rapidly built up into complex, 3D materials.

In accordance with various embodiments of the present invention, optical window 110 provides an entry point into the exposure chamber 120 with low optical aberrations for light from the optical pattern generator 140 and optical monitoring system 150. The external surface of optical window 110 can be designed to conform to a specified shape (e.g., flat or spherical) to within a fraction of the optical wavelength and allows this shape to be maintained during the exposure. As a result, optical window 110 may have a specified level of stiffness.

Figure 3A:
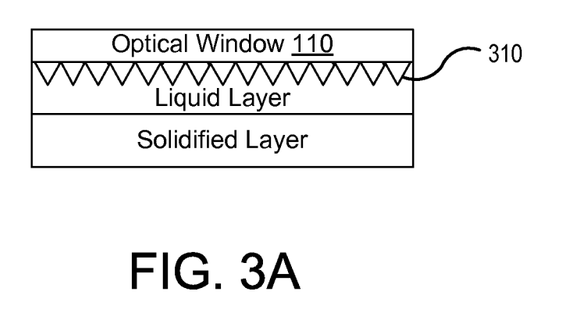
FIGS. 3A and 3B illustrate the effect of liquid layer thickness on effective resolution of a mold in the liquid deposition photolithography system.
Figure 3B:
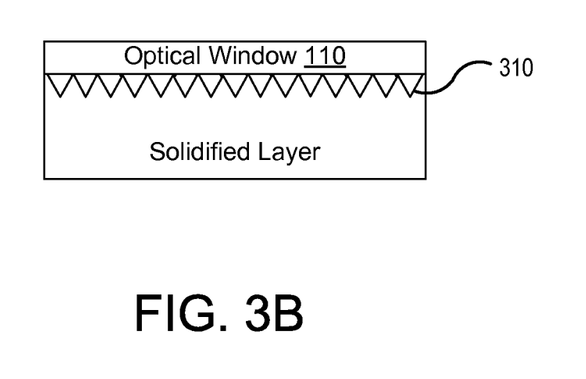

To determine the shape of the upper, working surface of the component being formed, the inner surface of optical window 110 may be a mold against which the liquid precursors are solidified such that each layer of solidified material takes on the approximate shape of the mold. This mold may be a simple shape (e.g., flat or spherical) and/or have a complex micro- to nano-scale profile (e.g., a diffraction grating). In at least one embodiment, a liquid layer below the interior surface can be modulated in thickness to control the effective resolution of this molding process (see, e.g., FIG. 3).

In various embodiments, optical window 110 may provide a closed chamber such that hydraulics (aka. micro-fluidics) can be used to control the flow of one or more liquid materials into and out of exposure chamber 120. In some cases, pressure applied to an external source of liquid and/or motion of the platform can transport new liquid into the exposure chamber 120. Depending on the Reynolds number, this transport can be laminar.

The interior of optical window 110 may be arranged to resist attachment of the solidified liquids such that high throughput one-photon absorption can be used for the photolithography. The inner surface may be resistant to bonding with solidifying liquid precursors. In some embodiments, this "non-stick" behavior may include a chemical treatment of the window. Photo-nanoimprint lithography can be used to coat the soft (e.g., polydimethylsiloxane (PDMS)) mold with a chemical release agent before UV curing. Here, many layers may be sequentially fabricated against this treatment. Scanning or projection optical lithography can selectively pattern the material properties including liquid/solid phase, density, index, or chemical composition. The interior of optical window 110 can shape the surface of the part on large scale (e.g., a lens) or on fine scale similar to photo-nanoimprint lithography.

The exterior of optical window 110 may be of sufficient surface optical quality that is low scatter and approximating the desired shape to within a fraction of the optical wavelength. Optical window 110 can be flat, spherical or aspherical to satisfy requirements of the optical pattern generator (e.g., mask projection optics) or to conform to the shape of the interior surface. The body of optical window 110 may include multiple layers and/or internal fluidic channels that may be sufficiently stiff to maintain its interior and exterior shape under pressure of material delivery system 130. In some embodiments, optical window 110 may be of low volume optical scatter and volume phase uniform to enable sufficient contrast and resolution for the light from the optical pattern generator 140 and optical monitoring system 150.

The interior of optical window 110 may typically have larger surface roughness and/or surface height variation since the difference of the index of optical window 110 and the liquid materials is much lower than the difference of the index of the window and air. That is, the optical quality of optical window 110 may be dominated by the exterior surface with its large index contrast to air, not the interior surface with its low index contrast to the liquid material precursors. In some embodiments, the interior of optical window 110 may be a flat surface or have a non-flat, large-scale shape (e.g., spherical) which will mold the shape of the resulting solid part. In one embodiment, the interior of optical window 110 may have fine-scale detail as is known in the art of photo-nanoimprint lithography. If liquid precursors fill in the fine detail of interior surface mold, then layers may take on only the large-scale structure. However, the final exposure can consume the inhibitor, solidifying the final layer into the fine-scale structure of the mold as in photo-nanoimprint lithography.

Exposure chamber 120 may include thermal control to modulate the rate of chemical reactions or diffusion. Exposure chamber 120 may be sealed (in the manner of a syringe exterior) or not, depending on the needs of other system components, chiefly material delivery system 130. The sides of the chamber can either move with the base platform plus material or the sides can be fixed in position. In the latter case, the fabricated part must not adhere to the chamber sides as the base platform is moved, or the part will be damaged. Any of the methods discussed above for optical window 110 are appropriate to maintain a non-stick behavior at the chamber sides. Some embodiments limit optical exposure of the liquid precursors such that the material adjacent to the chamber sides stays in a liquid state.

If a photosensitive, liquid layer remains at the edge of the part (e.g., lens) after some thickness has been built up and base platform 160 is stopped, the full part area can be exposed to light. This will cause the liquid layer at the edges of the part to solidify out to the sides of the chamber. The solid part of the chamber may now be removed and: remain together, providing an external "package" to the fabricated part, or the chamber can be removed, forming a "mold" for the part in order to provide a specific shape and/or surface finish to the edges of the part.

Materials are introduced into processing system 100 as liquids and exit either via incorporation into the finished part or as "waste" liquids expelled from exposure chamber 120. Useful materials are generally those that interact with light (e.g., photopolymerizable resins) or the previously fabricated structure (e.g., solvent). Photosensitive materials can include those known in the art such as photopolymerization, photo-labile (bonds that break on optical exposure), or other photo-initiated chemical changes. Non-photosensitive materials can include materials which diffuse, materials with intentionally specified optical absorption (e.g., to block optical penetration to previously fabricated layers), materials which contain suspensions of nanoparticles, cells or other small solids, or materials which chemically or physically interact with previously deposited material (e.g., solvents or developers).

An unusual material interaction possible in processing system 100 is the use of optical tweezing or trapping forces to manipulate the locations and orientations of solids suspended within a liquid. That is, some portion of the optical pattern, if focused sufficiently, can attract or repel cells, nanoparticles, carbon nanotubes, etc. and arrange these into specified patterns within the liquid layer. If this layer is later solidified by heat or photo-curing, this arrangement is permanent. Individual materials can encompass more than one of these properties, e.g., photopolymerizable liquids with diffusing monomers or suspended nanoparticles.

Material delivery system 130 delivers liquid materials that may be manipulated through micro-fluidic techniques including, but not limited to, the following: 1) base platform 160 motion including simple movement away from the platform but also more complex in/out trajectories; 2) more complex base platform 160 motion including rotation; 3) pumping of material into or out of exposure chamber 120; 4) laminar flow of one or more materials to create multiple-material particles in a single exposure; and 5) non-laminar flow via an explicit mixer or through choice of channel dimensions. The platform height can be changed to control the Reynolds number and thus flow properties across the part.

Optical pattern generator 140 can be used to generate an optical pattern using a variety of techniques. In some embodiments, mask projection including both fixed and reconfigurable (e.g., liquid crystal) masks may be used. In addition, computer generated holograms can be used in various embodiments. The computer generated holograms can include including both fixed and reconfigurable (e.g., liquid crystal) holograms. In addition, mask proximity techniques may be used in one or more embodiments. Optical pattern generator 140 can produce a scanning focus via lens motion, galvo scanners, acoustooptic scanners, or other techniques/components. Optical pattern generator 140 may include multiple such methods, possibly operating at separate wavelengths. For example, some embodiments provide for the trapping of live cells in the infra-red using a liquid-crystal spatial light modulator to generate holograms and photopolymerization of monomer in the near UV using fixed mask projection.

Optical monitoring system 150 can be used to measure properties of the fabricated part (e.g., layer thickness or optical index) in order to provide fine control of these properties. Traditional measurement and control of layer thickness can also be used. In some embodiments, optical monitoring system 150 can measure alignment of the base platform 160 or the partially-fabricated part in order to enable registration of the optical pattern to these pre-existing features. Various traditional and novel alignment techniques can be used to align a mask to an existing pattern.

Base platform 160 facilitates introduction of new liquid material between previously-exposed and solidified materials and the window by moving away from the window. In some embodiments, base platform 160 can move continuously or may stop during optical exposures (called "stop-flow lithography"). More complex motion profiles may be used to implement specific processes. For example, the platform can be moved away from optical window 110 to allow a larger thickness of liquid between exposures steps, then returned to create a thin layer before the next photo-exposure. This can be useful in solvent wash steps or to provide larger volumes of diffusing materials.

Base platform 160 may be transparent or reflective in order to enable optical monitoring of the process. Base platform 160, like the interior of optical window 110, may provide the function of a mold from which the finished part will be removed. Alternatively, base platform 160 may remain with the part as an integral component of the finished device. In some cases, base platform 160 may comprise one or more of the following: 1) a simple substrate such as an optical flat or a semiconductor wafer; 2) an optical component such as a lens, thin-film filter, crystal, or polarizer; 3) an electrical, optical, or mechanical element or any combination thereof (e.g., a CMOS circuit, electro-optic modulator, or MEMS); 4) living tissue; and/or 5) an optical absorber to suppress optical reflections into the exposure region.

Figure 2:
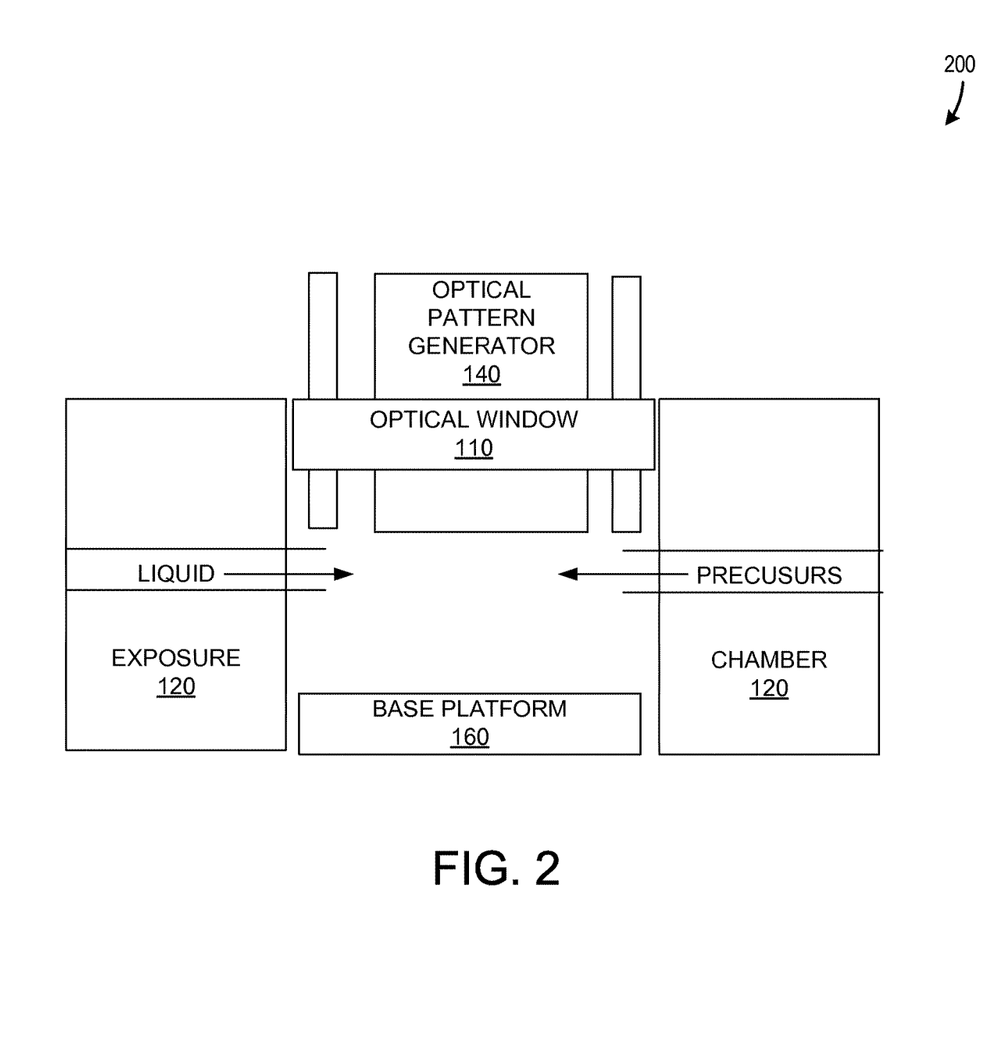
FIG. 2 illustrates a simplified physical layout of a liquid deposition photolithography processing environment according to some embodiments of the present invention.

FIG. 2 illustrates block diagram 200 of a simplified physical layout of a processing environment according to some embodiments of the present invention. In accordance with some embodiments, optical window 110 forms the upper surface of the mold. Optical patterns generated by optical pattern generator 140 may pass through optical window 110 onto the structure. In one or more embodiments, optical window 110 allows the optical pattern to enter exposure chamber 120 without perturbation and may hold and/or shape the structure.

Optical window 110 may be composed of glass or other materials and may be used with a "nonstick" surface layer, in which such surface layers are composed usually with PDMS or fluorinated groups. Other examples of the window/mold material may be composed of a solid infused with a liquid. In such an arrangement, the solid provides mechanical support and shape retention, whereas the liquid provides a replenishable release layer.

The inner surface of optical window may be resistant to bonding with solidifying liquid precursors. This "non-stick" behavior may include a chemical treatment of the window. For example, in one embodiment, photo-nanoimprint lithography can be used to coat the soft (often PDMS) mold with a chemical release agent before UV curing. Here, many layers are sequentially fabricated against this treatment, thus the requirements are more stringent in this case. In other embodiments, a layer of liquid material precursors in a non-photosensitive state directly adjacent to the solid optical window may be used. This layer of liquid material precursors may be uniform for each layer or may be varied between layers.

A non-photosensitive layer may be applied directly adjacent to the solid optical window transported into the exposure chamber. This may include a liquid layer transported via laminar flow or a gaseous (air) layer maintained by a super hydrophobic surface on the inner window face. In some cases, a liquid layer of material precursor rendered non-photosensitive by the presence of a chemical inhibitor. This may include inhibition and consumption of photosensitive species via an inhibiting chemical species which diffuses from the inner surface of the optical window into the immediately adjacent layer of material precursor. This diffusing inhibitor can be initially absorbed into a permeable solid layer (e.g., PDMS) on the inner surface of the window. The inhibitor diffuses out of the permeable layer into the immediately adjacent material precursors, providing a thin, non-photosensitive layer directly adjacent to the window. Typically, the quantity of inhibitor is finite. In addition, although diffusion of new inhibitor from an external source is possible, diffusion time scales as the square of the distance, and thus the time for this transport along the length of the permeable solid layer is much greater than diffusion time of inhibitor through the thickness thin layer. Thus, the layer becomes depleted of inhibitor long before new inhibitor can diffuse in from the edges to replace it, justifying the concept of this approach as a finite capacity source of the inhibiting species.

As the concentration of the inhibitor drops, the thickness of the non-photosensitive layer directly adjacent to the window will generally decrease until it reaches zero as the inhibitor is consumed, at which point the solidifying precursors have the potential to bond with the inner window surface. Thus maintenance of a constant and/or nonzero liquid-layer thickness during fabrication of thick parts that consume significant inhibitor motivates transport or generation of new inhibitor via means other than diffusion through the solid permeable layer. These can include transport of replacement inhibitor dissolved in the inserted liquid. When using $O_2$ as the inhibitor, some level of this effect is nearly unavoidable due to the presence of atmospheric oxygen. In addition, translation of the permeable solid layer, possibly including the outer optical window, can be used to replace the depleted permeable solid with a new region which has higher inhibitor concentration. The depleted region can be discarded or recharged with inhibitor for later use. This may be thought of as the "printer ribbon" approach. The inhibitor can be carried through the solid permeable layer via microfluidic channels in a circulatory system. The optical window can be permeable to inhibitor such that it can be efficiently transported through the thickness of the solid window. Micro-porous glass such as Vycor could fill this role.

Inhibitor can be generated within the solid permeable layer via a chemical process. This chemical process can be initiated by one or more of the following: 1) the light used for photopatterning such that the inhibitor is generated near the areas where it is being consumed; 2) light of a different wavelength than that used for photo-patterning which can provide independent control over the location and concentration of generated inhibitor; 3) heat; and/or 4) chemical reaction with some species present in the liquid precursors. Preferably, the species present in the window acts as a catalyst for the species carried by the liquid such that inhibitor is generated exclusively near the window/liquid interface (due to the localization of catalyst) and the supply of inhibitor is unlimited (due to transport with the entering liquid precursor).

In some embodiments, optical trapping and photopolymerization can be combined to enable complex hybrid materials. For example, silica beads can be trapped in liquid with 514 nm light patterned by a liquid-crystal phase modulator. The liquid may be mainly water with a small (~10%) fraction of polymerizable material (ethylene glycol). When illuminated with UV light, the liquid becomes a solid hydrogel, locking the trapped materials permanently in this configuration. Subsequent layers can add new structures to build up complex 3D tissue scaffolds or other hybrid materials.

FIGS. 3A-3B illustrate the effect of liquid layer thickness on effective resolution of a mold in a liquid deposition photolithography system. As illustrated in FIG. 3A, a liquid layer with thickness greater than the surface features of the mold effectively screens these features from the solidified layer. In FIG. 3B, a liquid layer with thickness less than the surface height (including no liquid layer) results in a solidified material surface approximating the fine-scale profile of the mold 310.

Figure 4:
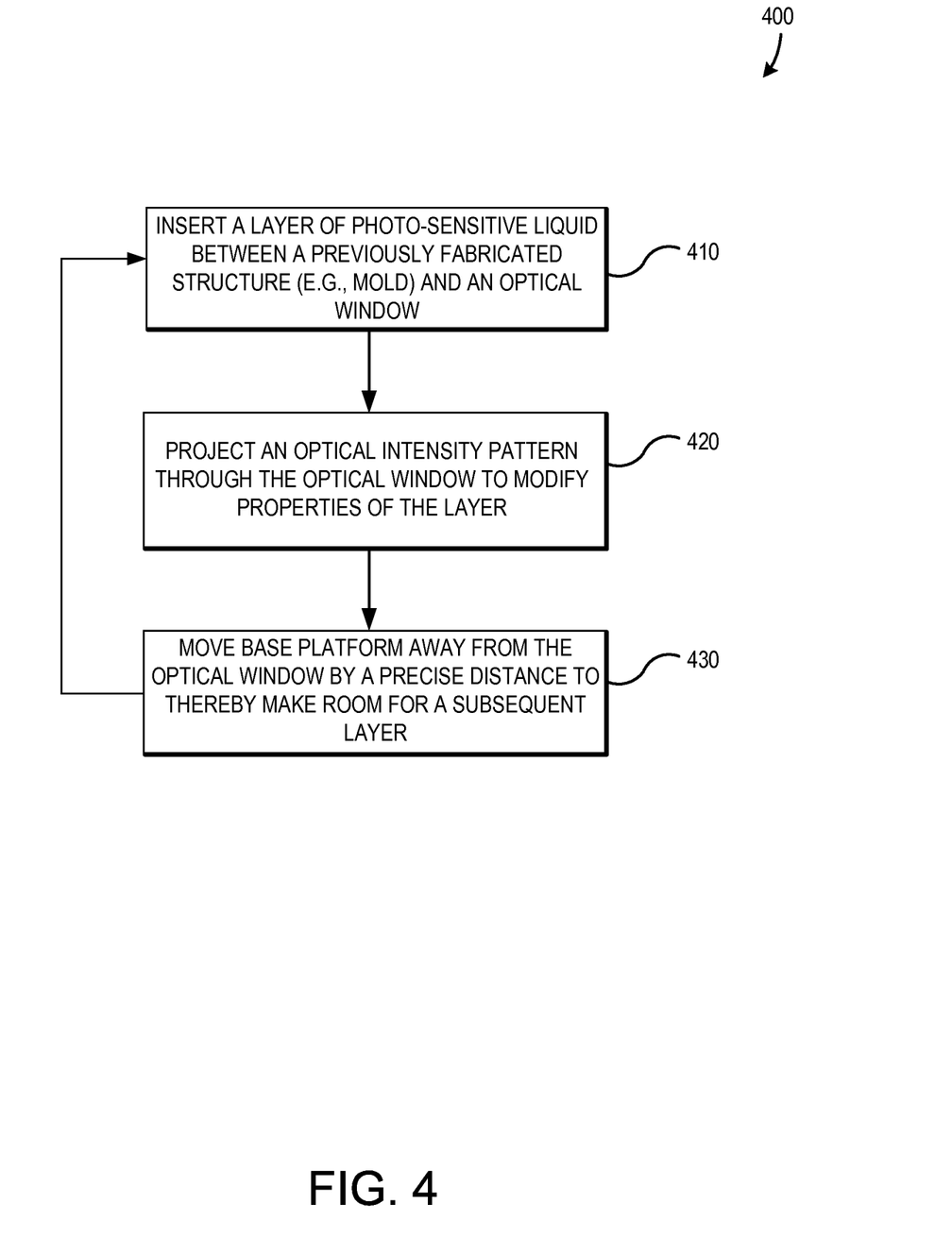
FIG. 4 is flowchart with a set of operations for practicing liquid deposition photolithography.

FIG. 4 is flowchart with a set of operations 400 for practicing liquid deposition photolithography in accordance with one or more embodiments of the present invention. As illustrated in FIG. 4, insertion operation 410 inserts a liquid layer between the previously-fabricated structure and the optical window. Projection operation 420 projects an optical pattern through the window to modify the properties of the photo-sensitive liquid. One example of such modification is photopolymerization which can cause hardening, diffusion, or solvent resistance. In some embodiments, the photo-sensitive process can be constrained from occurring immediately adjacent to the mask by, for example, using a chemical inhibitor which slowly diffuses out of the bottom layer of the window to create a thin layer of liquid material which has no sensitivity. As a result, the bottom of the window provides the function of a mold—flat or otherwise—while the liquid layer created by the photoinhibitor functions as the mold release. In this implementation, there is no wear on the mold because solid material is never in contact. Adjustment operation 430 moves the base platform relative to the optical window along a trajectory profile (e.g., away from the optical window by a precise distance) to make room for the next layer. The process is repeated.

Figure 5:
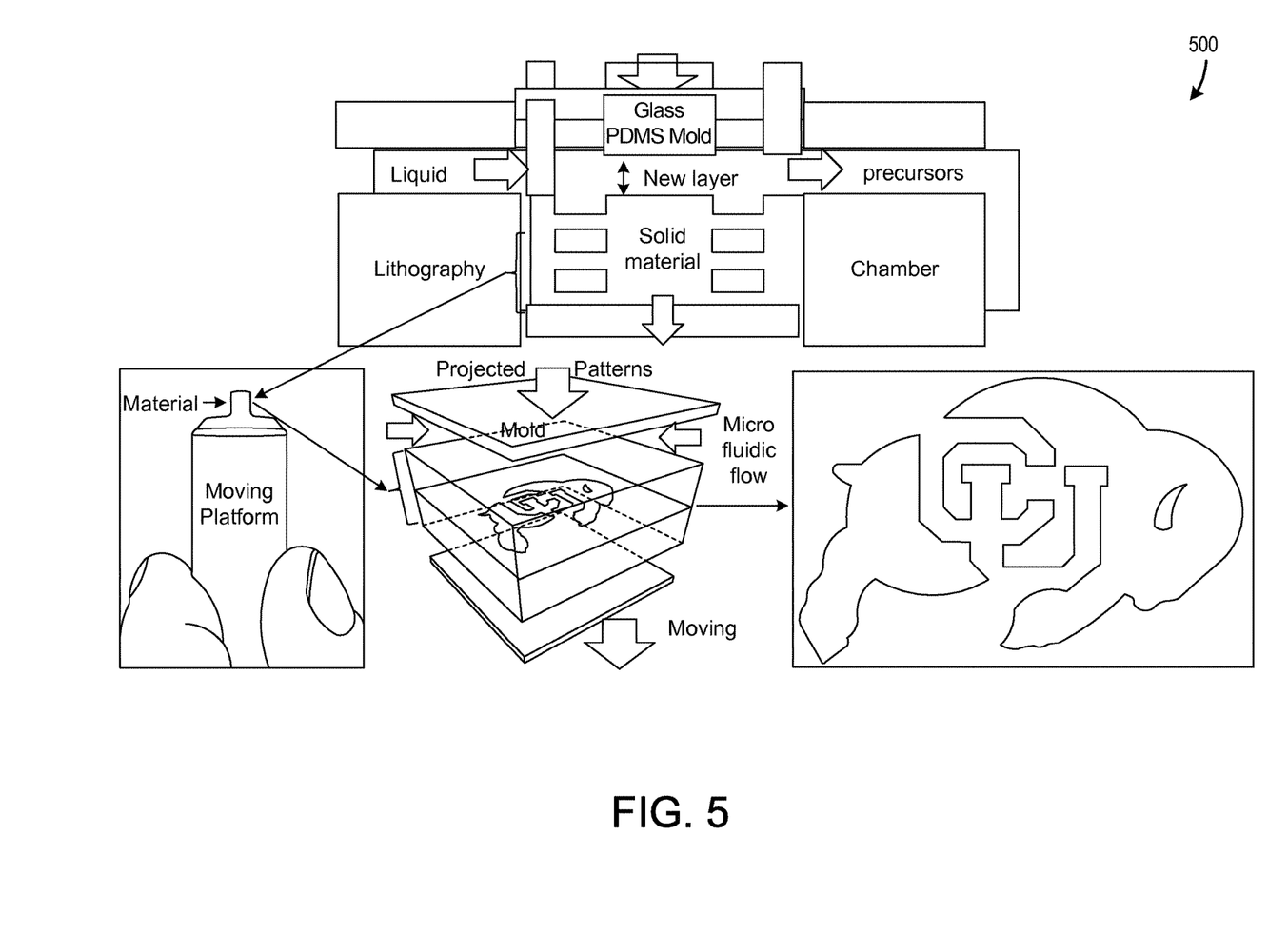
FIG. 5 illustrates a fabrication process for multi-layer index-of-refraction 3D structures in accordance with one or more embodiments of the present invention.
Figure 6:
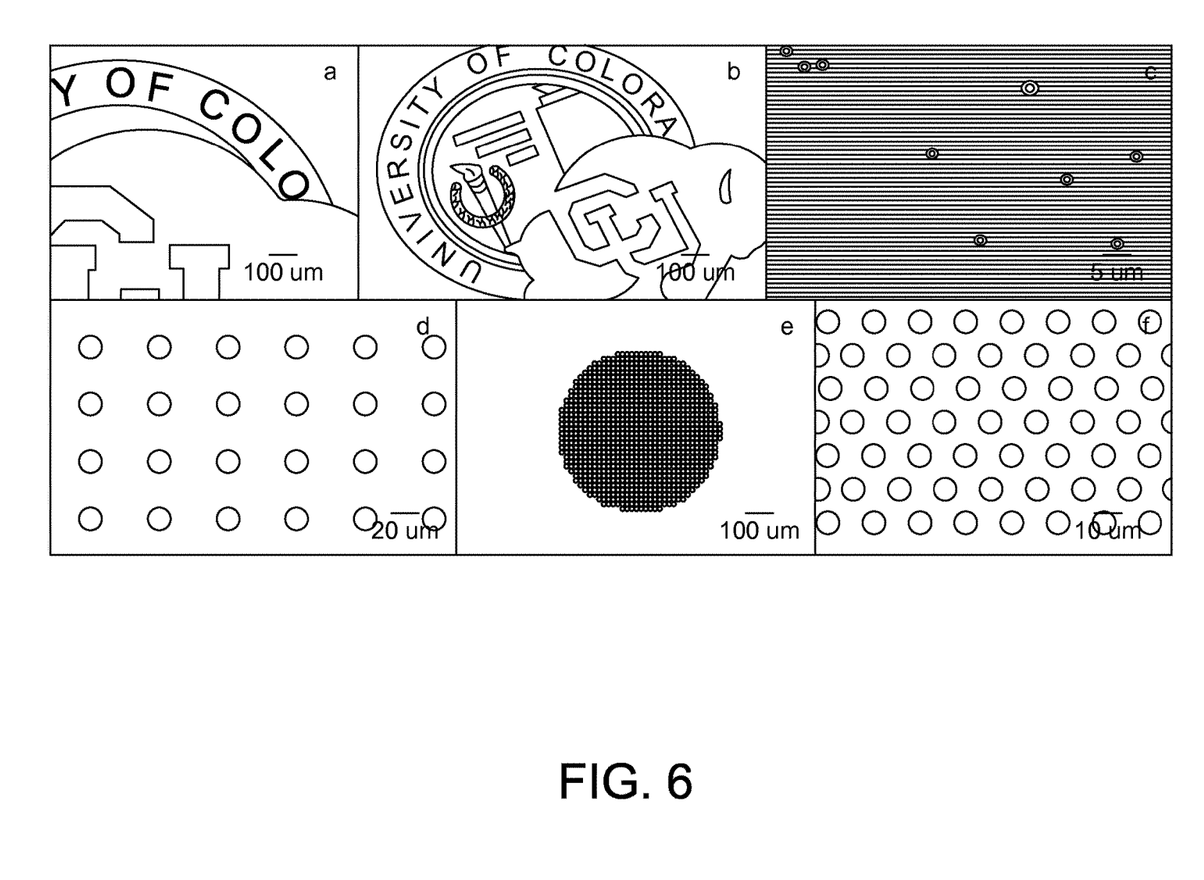
FIG. 6 illustrates samples of multi-layer parts, holograms, waveguide arrays, and photonic crystal waveguides which may be produced in accordance with various embodiments of the present invention.

FIGS. 5 and 6 show how multiple layers can be sequentially fabricated to build complex optical devices. In this case, the photopolymer allows diffusion of monomer after the exposure is completed, causing exposed regions to develop an increased index of refraction as is known in the art of holographic photopolymers. This implementation enables nearly arbitrary 3D distributions of index. The rapid sequential deposition and exposure of sub-micron thin layers enables high resolution 3D index structures for high throughput optical element fabrication. The combination of high resolution index structuring and throughput are not possible with other fabrication techniques. More specifically, FIG. 5 illustrates a fabrication process for multi-layer index-of-refraction 3D structures while FIG. 6 illustrates samples of multi-layer parts, holograms, waveguide arrays, and photonic crystal waveguides which may be produced.

Exemplary Computer System Overview

Figure 7:
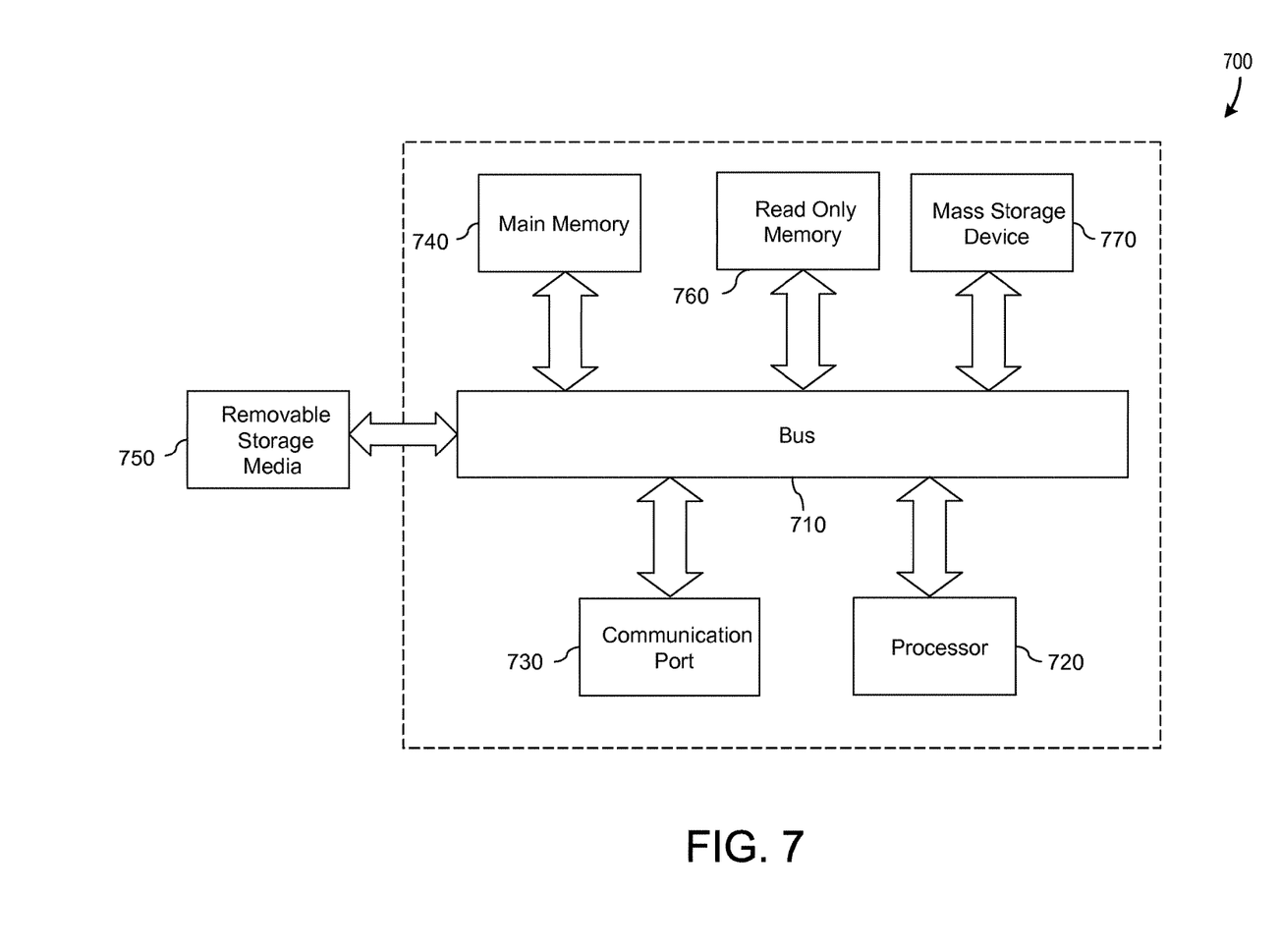
FIG. 7 illustrates an exemplary computer system that may be used in one or more embodiments of the present invention.

Embodiments of the present invention include various steps and operations, which have been described above. A variety of these steps and operations may be performed by hardware components or may be embodied in machine-executable instructions, which may be used to cause a general-purpose or special-purpose processor programmed with the instructions to perform the steps or cause one or more hardware components to perform the steps. Alternatively, the steps may be performed by a combination of hardware, software, and/or firmware. As such, FIG. 7 is an example of a computer system 700 with which embodiments of the present invention may be utilized. According to the present example, the computer system includes a bus 710, at least one processor 720, at least one communication port 730, a main memory 740, a removable storage media 750, a read only memory 760, and a mass storage 770.

Processor(s) 720 can be any known processor, such as, but not limited to, an Intel® Itanium® or Itanium 2® processor(s), or AMD® Opteron® or Athlon MP® processor(s), or Motorola® lines of processors. Communication port(s) 730 can be any of an RS-232 port for use with a modem-based dialup connection, a 10/100 Ethernet port, or a Gigabit port using copper or fiber. Communication port(s) 730 may be chosen depending on a network such a Local Area Network (LAN), Wide Area Network (WAN), or any network to which the computer system 700 connects.

Main memory 740 can be Random Access Memory (RAM), or any other dynamic storage device(s) commonly known in the art. Read only memory 760 can be any static storage device(s) such as Programmable Read Only Memory (PROM) chips for storing static information such as instructions for processor 720.

Mass storage 770 can be used to store information and instructions. For example, hard disks such as the Adaptec® family of SCSI drives, an optical disc, an array of disks such as RAID, such as the Adaptec family of RAID drives, or any other mass storage devices may be used.

Bus 710 communicatively couples processor(s) 720 with the other memory, storage and communication blocks. Bus 710 can be a PCI/PCI-X or SCSI based system bus depending on the storage devices used.

Removable storage media 750 can be any kind of external hard-drives, floppy drives, IOMEGA® Zip Drives, Compact Disc-Read Only Memory (CD-ROM), Compact Disc-Re-Writable (CD-RW), or Digital Video Disk-Read Only Memory (DVD-ROM).

The components described above are meant to exemplify some types of possibilities. In no way should the aforementioned examples limit the scope of the invention, as they are only exemplary embodiments.

In conclusion, the present invention provides novel systems, methods and arrangements for liquid deposition photolithography. While detailed descriptions of one or more embodiments of the invention have been given above, various alternatives, modifications, and equivalents will be apparent to those skilled in the art without varying from the spirit of the invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof. Therefore, the above description should not be taken as limiting the scope of the invention, which is defined by the appended claims.

What is claimed:

1. A system for liquid deposition photolithography comprising:
    an exposure chamber;
    an optical window into the exposure chamber;
    a base platform configured to articulate a part with respect to the optical window;
    a pattern generator configured to project an optical pattern onto the part through the optical window to optically expose and thereby modify properties of a layer of photo-sensitive liquid between the base platform and the optical window;
    a material delivery system configured to deliver materials into the exposure chamber, including:
        a first system positioned for delivering the photo-sensitive liquid; and
        a second system positioned for delivering an inhibitor that maintains the photo-sensitive liquid in liquid form adjacent to the optical window; and
    one or more processors configured to cause the base platform to continuously move during optical exposure closer to or farther away from the optical window.

2. The system of claim 1, wherein the exposure chamber is closed and the material delivery system uses micro-fluidic injection to control the flow of the materials into and out of the exposure chamber.

3. The system of claim 1, wherein the material delivery system uses fluidic injection to control the flow of the materials into and out of the exposure chamber.

4. The system of claim 1, wherein the optical window provides a mold for the part.

5. The system of claim 4, wherein the mold is flat, spherical, or includes a complex micro- to nano-scale profile.

6. The system of claim 4, wherein the mold includes a diffraction grating.

7. The system of claim 1, wherein the inhibitor is released through the optical window to maintain the photo-sensitive liquid in liquid form adjacent to the optical window.

8. The system of claim 7, wherein the photo-sensitive liquid in liquid form adjacent to the optical window is maintained around a set thickness by adjusting the release of the inhibitor.

9. The system of claim 7, wherein the inhibitor is carried through a solid permeable layer via channels.

10. The system of claim 1, wherein the exposure chamber includes thermal control.

11. The system of claim 1, further comprising an optical monitoring system to measure properties of the part.

12. The system of claim 1, wherein the base platform can rotate and move in accordance with a planned trajectory between optical exposures by the pattern generator.

13. The system of claim 1, wherein the optical window includes internal channels.

14. The system of claim 13, wherein the internal channels can be used to deliver resin, inhibitor, solvent, or a mixture of resin, inhibitor and solvent.

15. The system of claim 1, wherein the one or more processors are configured to cause the base platform to move along a desired trajectory.

16. The system of claim 15, wherein the desired trajectory of the base platform includes a rotation.

17. The system of claim 15, wherein the desired trajectory adjusts a height of the base platform to control flow properties across the part.

18. The system of claim 15, wherein the sides of the exposure chamber move with the base platform.

19. The system of claim 1, wherein the base platform becomes an integral component of the part.

20. The system of claim 1, wherein the material delivery system can deliver the materials through one or more of the optical window, a wall of the exposure chamber, or a flow from a surrounding bath of materials.

21. The system of claim 1, wherein the non-photosensitive layer adjacent to the optical window is delivered via laminar flow.

22. A liquid deposition system comprising:
an exposure chamber;
an optical window into the exposure chamber;
a pattern generator configured to project an optical pattern through the optical window to thereby modify properties of a layer of photo-sensitive liquid; and
a material delivery system to deliver materials into the exposure chamber, including:
 a first system positioned for delivering the photo-sensitive liquid into the exposure chamber; and
 a second system positioned for delivering an inhibitor through a solid permeable layer via channels formed in the optical window.

23. The system of claim 22, wherein the material delivery system can deliver the materials through one or more of the optical window, a wall of the exposure chamber, or flow from a surrounding bath of materials.

24. The system of claim 22, wherein the material delivery system transports a non-photosensitive layer adjacent to the optical window.

25. The system of claim 22, wherein the materials delivered by the material delivery system include a solvent, a resin, an inhibitor, a non-photo-sensitive material, or a mixture thereof.

26. The system of claim 22, further comprising a mold release layer that includes a non-miscible liquid or gel.

27. The system of claim 22, further comprising one or more processors configured to cause the base platform to continuously move during optical exposures.

28. A system for liquid deposition photolithography comprising:
an exposure chamber;
an optical window adjacent the exposure chamber;
a base platform movable with respect to the optical window;
a pattern generator positioned to project an optical pattern through the optical window to optically expose and thereby modify properties of a layer of photo-sensitive liquid between the base platform and the optical window;
a material delivery system positioned to deliver materials into the exposure chamber, including:
 a first system positioned for delivering the photo-sensitive liquid into the exposure chamber; and
 a second system positioned for delivering an inhibitor that maintains the photo-sensitive liquid in liquid form adjacent to the optical window; and
one or more processors configured to cause the base platform to continuously move closer to or farther away from the optical window during consecutive optical exposure and material delivery cycles.

* * * * *